United States Patent
Zhang et al.

(10) Patent No.: US 11,139,790 B2
(45) Date of Patent: Oct. 5, 2021

(54) DISTRIBUTED AMPLIFIER WITH LOW SUPPLY VOLTAGE AND LOW POWER CONSUMPTION FOR FULL-CHIP HIGH-SPEED COMMUNICATION

(71) Applicant: Industrial Technology Research Institute, Hsinchu (TW)

(72) Inventors: Jie Zhang, New Taipei (TW); Tai-Hsing Lee, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 28 days.

(21) Appl. No.: 16/749,628

(22) Filed: Jan. 22, 2020

(65) Prior Publication Data

US 2021/0152142 A1    May 20, 2021

(30) Foreign Application Priority Data

Nov. 14, 2019   (TW) ................................. 108141357

(51) Int. Cl.
*H03F 3/60* (2006.01)
*H03F 3/21* (2006.01)
*H03F 1/02* (2006.01)

(52) U.S. Cl.
CPC ........... *H03F 3/607* (2013.01); *H03F 1/0205* (2013.01); *H03F 3/211* (2013.01)

(58) Field of Classification Search
CPC ......... H03F 3/607; H03F 1/0205; H03F 3/211
USPC ....................................................... 330/277
See application file for complete search history.

(56) References Cited

U.S. PATENT DOCUMENTS

| | | | |
|---|---|---|---|
| 4,543,535 A | 9/1985 | Ayasli | |
| 4,788,511 A | 11/1988 | Schindler | |
| 6,049,250 A | 4/2000 | Kintis et al. | |
| 6,400,226 B2 | 6/2002 | Sato | |

(Continued)

FOREIGN PATENT DOCUMENTS

| CN | 100514851 C | 7/2009 |
|---|---|---|
| CN | 103633954 A | 3/2014 |
| CN | 208768040 U | 4/2019 |

OTHER PUBLICATIONS

Saeed Mohammadi et al., "Design optimization and characterization of high-gain GaInP/GaAs HBT distributed amplifiers for high-bit-rate telecommunication", IEEE Transactions on Microwave Theory and Techniques • Jul. 2000, pp. 1030-1044 (Year: 2000).*

(Continued)

*Primary Examiner* — Hafizur Rahman (57) ABSTRACT

A distributed amplifier with low supply voltage and low power consumption is provided. The distributed amplifier includes an input terminal inputting an input signal; an output terminal outputting an output signal; an amplifier unit; a gate line circuit connected to the input terminal, a first load circuit and the amplifier unit; a second load circuit; a drain line circuit connected to the second load circuit, the amplifier unit and the output terminal; and a bias voltage circuit connected between the drain line circuit and the output terminal, wherein the bias voltage circuit includes a voltage source; an inductor connected to the voltage source and a terminal of the drain line circuit; and a capacitor multiplier connected to the inductor, the drain line circuit and the output terminal.

8 Claims, 6 Drawing Sheets

(56) References Cited

U.S. PATENT DOCUMENTS

| | | |
|---|---|---|
| 6,894,566 B2 | 5/2005 | Claveau et al. |
| 7,579,913 B1 | 8/2009 | Cheng et al. |
| 7,733,185 B2 | 6/2010 | Suzuki |
| 7,924,097 B2 | 4/2011 | Lender, Jr. et al. |
| 8,305,148 B2 | 11/2012 | Fung |
| 8,786,368 B2 | 7/2014 | Benson |
| 9,018,929 B2 | 4/2015 | Isham |
| 10,110,171 B2 | 10/2018 | Takahashi et al. |
| 10,122,325 B2 | 11/2018 | Benson |

OTHER PUBLICATIONS

Chen, I-Chuan et al, "3-10GHz CMOS distributed amplifier low-power and low noise and high-gain low noise amplifier for UWB systems," IEEE Region 10 Conference, Nov. 2010.

Huang, Tzu-Yuan et al, "A High-Gain Low-Noise Distributed Amplifier with Low DC Power in 0.18um CMOS for Vital Sign Detection Radar," IEEE MTT-S International Microwave Symposium, 2015.

Shin, Shih-Chieh et al., "A Low-Voltage and Variable-Gain Distributed Amplifier for 3.1-10.6 GHz UWB Systems," IEEE Microwave and Wireless Components Letters, vol. 16, No. 4, Apr. 2006.

Germanovix, Walter et al., "Capacitance Super Multiplier for SubHertz Low-Pass Integrated Filters," IEEE Transactions on Circuits and Systems—II: Express Briefs, vol. 65, No. 3, Mar. 2018.

Qi, Nan et al, "Co-Design and Demonstration of a 25-Gb/s Silicon-Photonic Mach-Zehnder Modulator With a CMOS-Based High-Swing Driver," IEEE Journal of Selected Topics in Quantum Electronics, vol. 22, No. 6, Nov. 2016.

Darweesh, Hala Y. et al, "New Active Capacitance Multiplier for Low Cutoff Frequency Filter Design," IEEE International Conference on Microelectronics, Dec. 2007.

Machiels, Brecht et al, "Power Efficient Distributed Low-Noise Amplifier in 90 nm CMOS," IEEE Radio Frequency Integrated Circuits Symposium, 2010.

\* cited by examiner

|  | voltage Vdd(V) | current Id(mA) | power Pdc(W) |
|---|---|---|---|
| traditional distributed amplifier | 10 | 121 | 1.21 |
| distributed amplifier of the disclosure | 3 | 173 | 0.53 |

DISTRIBUTED AMPLIFIER WITH LOW SUPPLY VOLTAGE AND LOW POWER CONSUMPTION FOR FULL-CHIP HIGH-SPEED COMMUNICATION

CROSS-REFERENCE TO RELATED APPLICATION

This application is based on, and claims priority from, Taiwan Application Serial Number 108141357, filed Nov. 14, 2019, the disclosure of which is hereby incorporated by reference herein in its entirety.

TECHNICAL FIELD

The disclosure relates to a distributed amplifier, and relates to a distributed amplifier with low supply voltage and low power consumption. The disclosure is suitable for application in a distributed amplifier for full-chip high-speed communication.

BACKGROUND

The modulator driving circuit is used to amplify a digital modulation signal in the light transmission front-end circuit, so as to drive a Mach-Zehnder modulator to modulate a laser light, and the electronic signal is modulated into a light signal. Since the Mach-Zehnder modulator requires a larger modulation signal to operate, the modulator driving circuit needs to have properties of high speed and high output amplitude to satisfy the requirements of the Mach-Zehnder modulator.

Since a distribution amplifier has good gain flatness and excellent frequency response, it is suitable for use in a wideband amplifier. However, the circuit structure of the distribution circuit may cause higher power consumption.

A position of a power supply of a traditional distributed amplifier is disposed behind an end resistor. When a current of the distributed amplifier is larger, the supply voltage generated by the power supply needs be to higher, thereby increasing the power consumption. The manner of decreasing the power consumption in the traditional distributed amplifier includes two technologies, such as decreasing current consumption of the internal amplifier unit and using inductors connected in parallel. The technology of decreasing current consumption of the internal amplifier unit may increase the complexity of the circuit design. The technology of using the inductors connected in parallel may increase the area of a chip.

Since the circuit property of the distributed amplifier requires the higher supply voltage, the power consumption of the entire circuit is increased and the temperature of the chip is increase. The excessive temperature of the chip may also affect the normal operation of other peripheral circuits and increases the energy required for heat dissipation. A bias voltage circuit of the traditional distributed amplifier is disposed on a side of a load resistor. Accordingly, when a large current passes through the resistor, a voltage drop is generated between two terminals of the resistor, thereby decrease a voltage of a drain line. Since the voltage of the drain line is decreased, if the voltage of the bias voltage circuit is not increased, the performance of the amplifier unit is decreased. However, if the voltage of the drain line is maintained, the voltage of the bias voltage circuit needs to be increased. In addition, when the voltage of the bias voltage circuit is increased, the power consumption of the circuit may also be greatly increased.

SUMMARY

The disclosure provides a distributed amplifier with low supply voltage and low power consumption for a full-chip high-speed communication. The distributed amplifier includes an input terminal, an output terminal, an amplifier unit, a gate line circuit, a first load circuit, a second load circuit, a drain line circuit, and a bias voltage circuit. The input terminal inputs an input signal. The output terminal outputs an output signal. The gate line circuit is connected to the input terminal, a first load circuit and the amplifier unit. The drain line circuit is connected to the second load circuit, the amplifier unit and the output terminal. The bias voltage circuit is connected between the drain line circuit and the output terminal, wherein the bias voltage circuit includes a voltage source; an inductor connected to the voltage source and a terminal of the drain line circuit; and a capacitor multiplier connected to the inductor, the drain line circuit and the output terminal.

BRIEF DESCRIPTION OF DRAWINGS

The disclosure can be completely understood by reading the subsequent detailed description and examples with references made to the accompanying drawings, wherein.

DETAILED DESCRIPTION OF DISCLOSED EMBODIMENTS

Hereinafter, a distributed amplifier according to the disclosure and embodiments including the distributed amplifier will be described with reference to related drawings. For clarity and convenience of illustration, the components in the drawings may be exaggerated or reduced in size and proportion. In the following description and/or claims, when an element is referred to as being "connected" of "coupled" to another element, the element may be directly connected or coupled to the another element or an intervening element may be existed. When an element is referred to as being "directly connected" or "directly coupled" to another element, an intervening element may not existed. Other words used to describe the relationship between elements or layers should be interpreted the same way. For convenience of understanding, the same elements in the following embodiments are described with the same reference numbers.

The disclosure modifies the position of the bias voltage circuit and introduces a capacitor multiplier (i.e., a capacitor amplifying unit). The disclosure uses a new manner of the bias voltage, thereby effectively decreasing the power consumption and achieving the design of full chip. At the same time, the disclosure modifies the position of the bias voltage circuit to decrease a voltage VD, and add the capacitor multiplier (i.e., the capacitor amplifying unit) to make the wideband signal to be passed through, thereby achieving the design of full chip, decreasing the voltage VD and decreasing the power consumption.

The distributed amplifier of the disclosure modifies the position of the bias voltage circuit to avoid the voltage difference generated by passing the large current through the load resistor resulted in increasing the voltage of the bias voltage circuit. In addition, the disclosure introduces the capacitor multiplier (i.e., the capacitor amplifying unit) to achieve the design of the full chip. The equivalent capacitance of the capacitor multiplier is equivalent to the capacitance multiplied by the gain of the transistor gm, and the effect is equivalent to the capacitance capacity being amplified by the gm times through the transistor.

Figure 1:
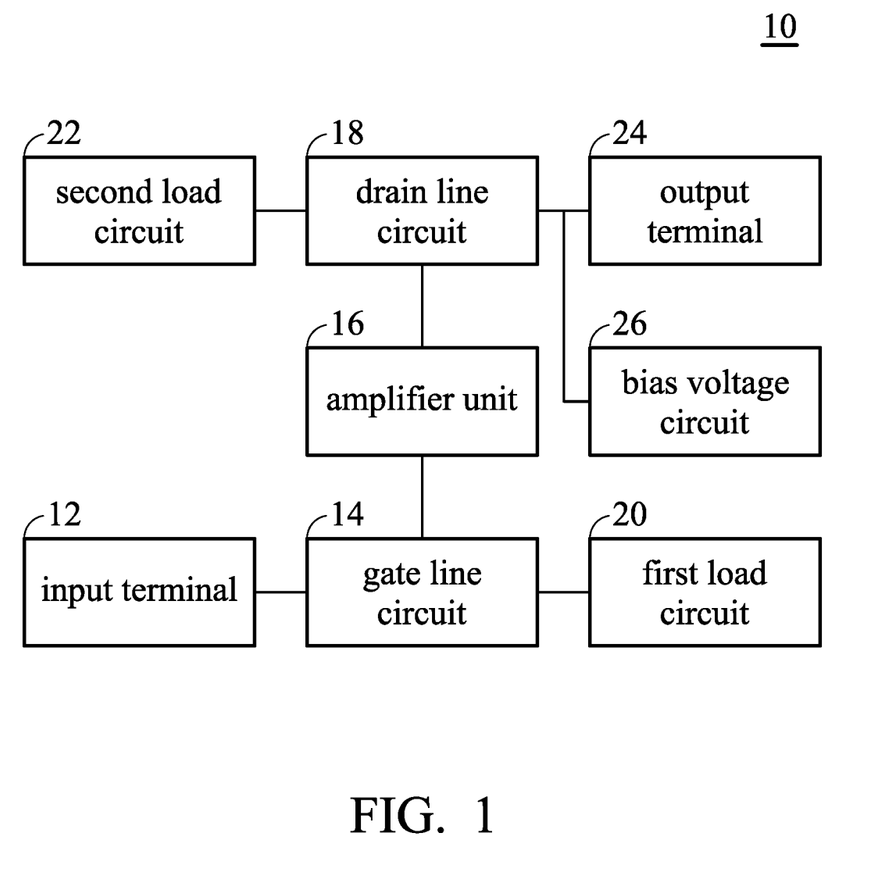
FIG. 1 shows a schematic view of a distributed amplifier with low supply voltage and low power consumption for a full-chip high-speed communication according to an embodiment of the disclosure.
Figure 2:
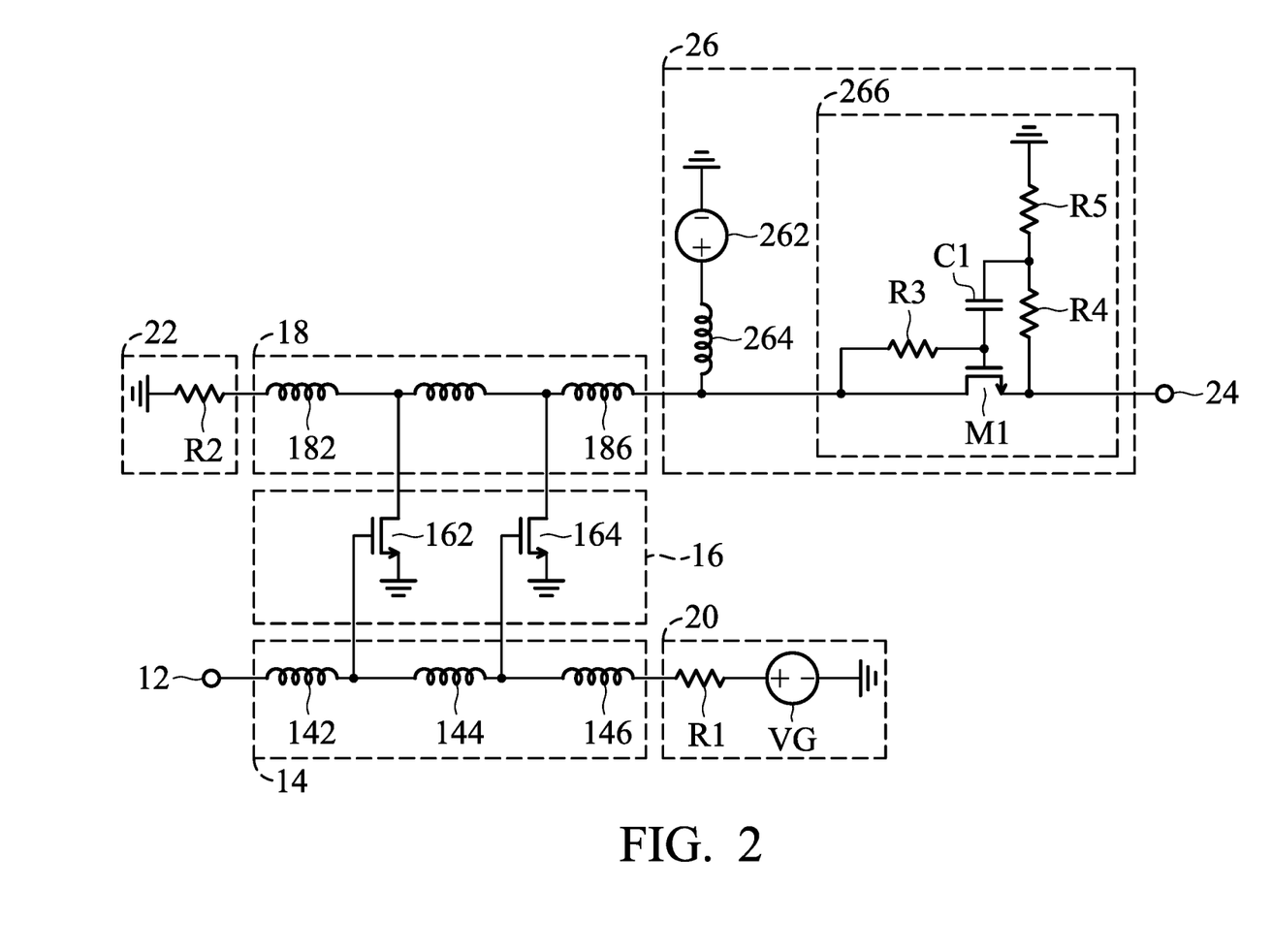
FIG. 2 shows a circuit diagram of a distributed amplifier with low supply voltage and low power consumption for a full-chip high-speed communication according to an embodiment of the disclosure.

FIG. 1 shows a schematic view of a distributed amplifier with low supply voltage and low power consumption for a full-chip high-speed communication according to an embodiment of the disclosure. FIG. 2 shows a circuit diagram of a distributed amplifier with low supply voltage and low power consumption for a full-chip high-speed communication according to an embodiment of the disclosure. Please refer to FIGS. 1 and 2. The position-encoding device 100 for the full-chip high-speed communication includes an input terminal 12, a gate line circuit 14, an amplifier unit 16, a drain line circuit 18, a first load circuit 20, a second load circuit 22, an output terminal 24 and a bias voltage circuit 26. The input terminal 12 inputs an input signal. The output terminal 24 outputs an output signal. The gate line circuit 14 is connected to the input terminal 12, the first load circuit 20 and the amplifier unit 16. The drain line circuit 18 is connected to the second load circuit 22, the amplifier unit 16 and the output terminal 24. The bias voltage circuit 26 is connected to the drain line circuit 18 and the output terminal. The bias voltage circuit 26 includes a voltage source 262; an inductor 264 connected to the voltage source 262 and a terminal of the drain line circuit 18; and a capacitor multiplier 266 connected to the inductor 264, the gate line circuit 14 and the output terminal 24.

When a voltage signal is input from the input terminal 12, the voltage signal enters the first load circuit 20 through the gate line circuit 14. In addition, after the voltage signal enters amplifier unit 16 to generate an amplified signal, the amplified signal is transmitted to the second load circuit 22 and the bias voltage circuit 26 through the drain line circuit. A current of the voltage power source 262 enters the second load circuit 22 through the inductor 264 and the drain line circuit 18, and the current is transmitted to the bias voltage circuit 26. In the embodiment, the first load circuit 20 includes a first resistor R1 and a gate bias voltage VG. The first resistor R1 is connected to the gate line circuit 14 and the gate bias voltage VG, and the gate bias VG is connected to a ground. The second load circuit 22 includes a second resistor R2 connected to the drain line circuit 18 and the ground. Therefore, the disclosure modifies the position of the bias voltage circuit to decrease the voltage of the power source 262, and adds the capacitor multiplier 266 to make the wideband signal to be passed through, thereby achieving the design of the full design, decreasing the voltage of the power source 262 and decreasing the power consumption.

In one embodiment, the amplifier unit 16 includes a first transistor 162 connected to the drain line circuit 18 and the gate line circuit 14, and a second transistor 164 connected to the drain line circuit 18 and the gate line circuit 14.

In one embodiment, the drain line circuit 18 includes a first inductor 182 connected to the second load circuit 22 and a second inductor 184, and a third inductor 186 connected to the second inductor 184 and the bias voltage circuit. In the embodiment, the first inductor 182 is connected to the second resistor R2 of the second load circuit 22.

In one embodiment, a drain of the first transistor 162 is connected to the first inductor 182 and the second inductor 184 of the drain line circuit 18. A drain of the second transistor 164 is connected to the second inductor 184 and the third inductor 186 of the drain line circuit 18.

In one embodiment, the gate line circuit 14 includes a fourth inductor 142 connected to the input terminal 12 and a fifth inductor 144, and a sixth inductor 146 connected to the fifth inductor 144 and the first load circuit 20. In the embodiment, the sixth inductor 146 is connected to the first resistor R1 of the first load circuit 20.

In one embodiment, a gate of the first transistor 162 is connected to the fourth inductor 142 and the fifth inductor 144 of the gate line circuit 14. A gate of the second transistor 164 is connected to the fifth inductor 144 and the sixth inductor 146 of the gat line circuit 14. In the embodiment, the sources of the first transistor 162 and the second transistor 164 are each connected to the ground.

In one embodiment, the capacitor multiplier 266 includes a third resistor R3 having a first terminal connected to the inductor 264 and a drain of a third transistor M1 and a second terminal connected to a gate of the third transistor M1 and a capacitor C1. Wherein a first terminal of the capacitor C1 is connected to the gate of the third transistor, a second terminal of the capacitor C1 is connected to a fourth resistor R4 and a fifth resistor R5. A first terminal of the fourth resistor R4 is connected to a source of the third transistor M1 and the output terminal 24. A second terminal of the fourth resistor R4 is connected to the fifth resistor R5. A first terminal of the fifth resistor R5 is connected to the fourth resistor R4. A second terminal of the fifth resistor R5 is connected to the ground.

The current of the voltage source 262 flows to the drain line circuit 18 and the capacitor multiplier 266, and the output signal is output from the output terminal 24. In the embodiment, the current of the power source 262 flows to the drain line circuit 18, and then flows to the ground through the amplifier unit 16. The current of the voltage source 262 flows to the second resistor R2 of the second load circuit 22 through the drain line circuit 18, so that the current flowed through the second resistor R2 is increased.

Figure 3A:
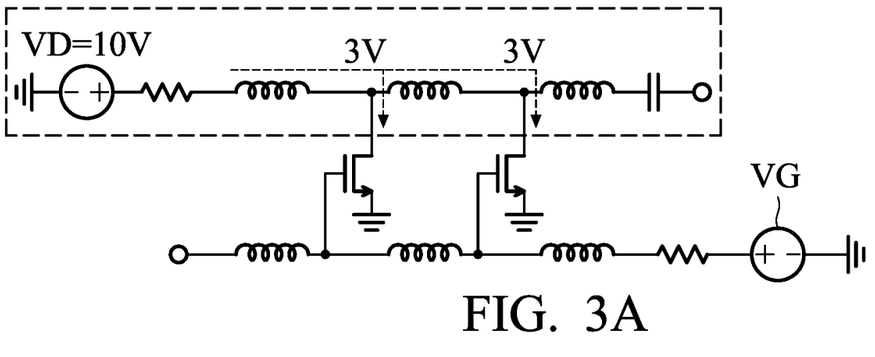
FIGS. 3A-3D show schematic views of simulations of the traditional distributed amplifier and the distributed amplifier of the disclosure.
Figure 3B:
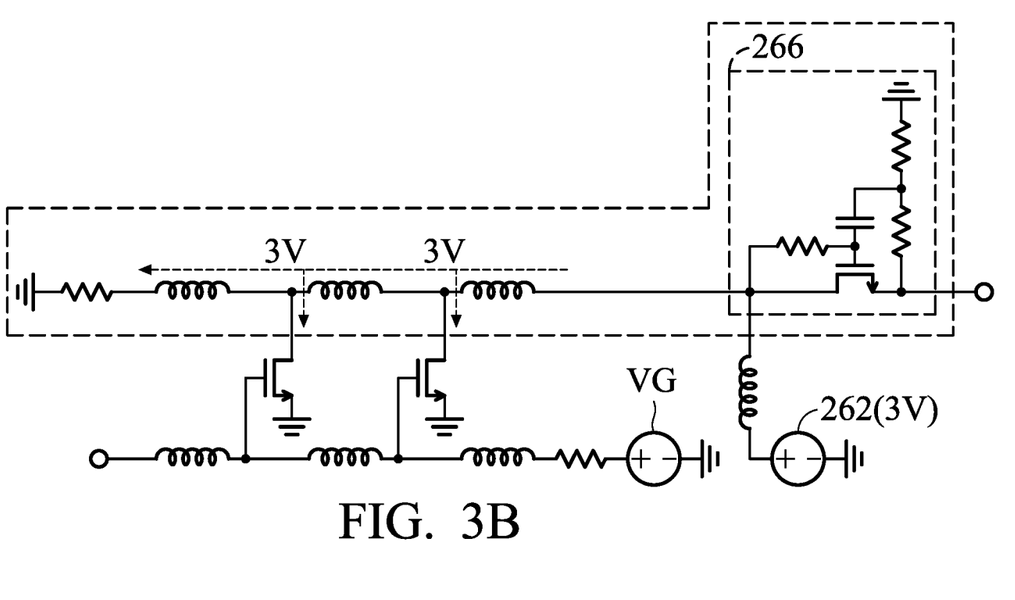
Figure 3C:
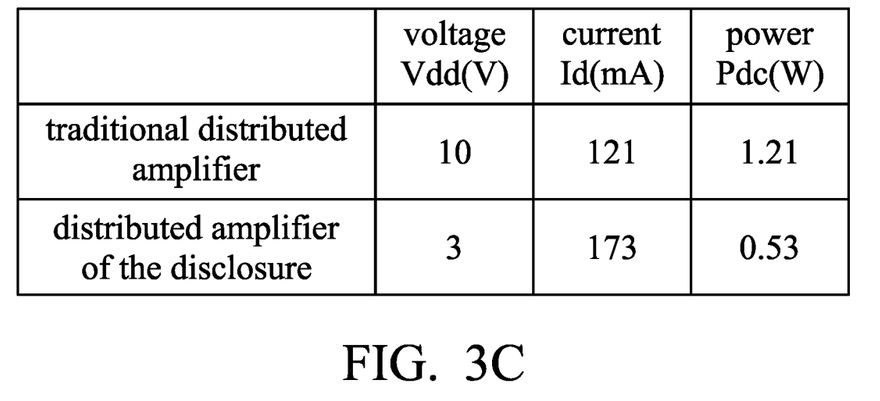
Figure 3D:
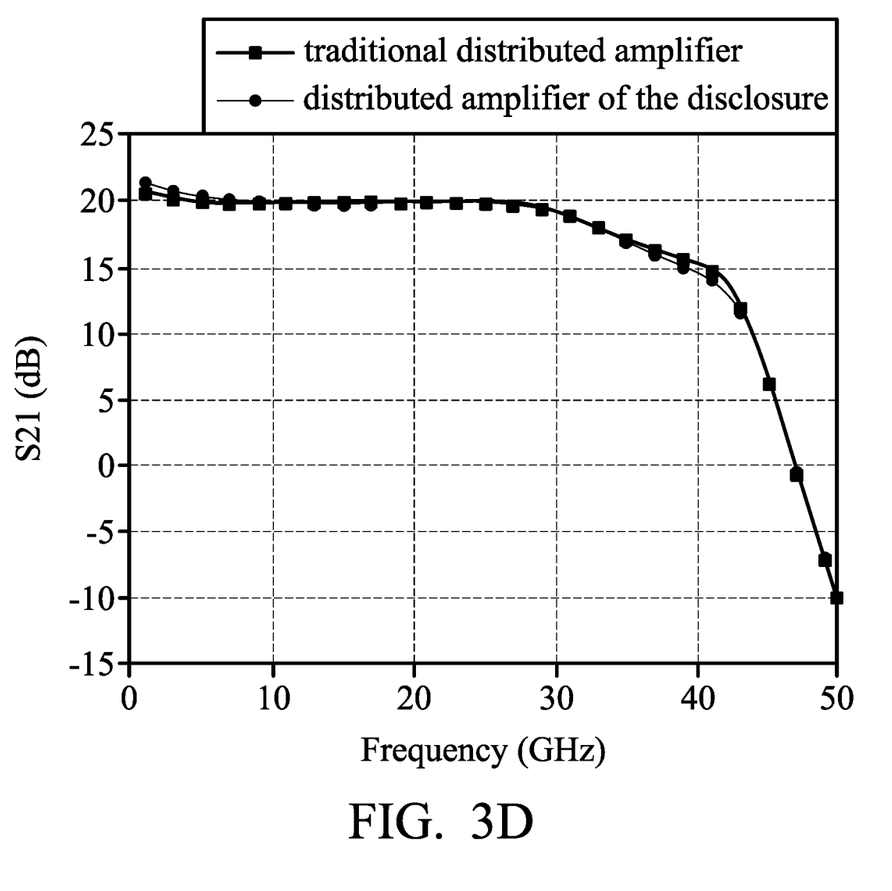

FIGS. 3A-3D show schematic views of simulations of the traditional distributed amplifier and the distributed amplifier of the disclosure. As shown in FIG. 3A, the position of the voltage source VD of the traditional distributed amplifier is disposed on a left side of the distributed amplifier, so that the current flows from the left side to the drain line circuit and then enters the amplifier unit, and the output signal is output from the output terminal. The capacitor and the inductor occupy a large area, so that the distributed amplifier may not be chipped. As shown in FIG. 3B, the power source 262 and the capacitor multiplier 266 of the distributed amplifier of the disclosure is disposed in a right side of the distributed amplifier, so that the flowing direction of the current is changed. That is, the current flows to the amplifier unit 16 and the second resistor R2 of the second load circuit 22 through the drain line circuit 18 from the right side to a left side, so that the current passed through the second resistor R2 is increased. The inductor 264 (Lchock) is a chock inductor which may prevent the high frequency signal flowing to the power source 262 from the drain line circuit 18. The capacitor multiplier 266 blocks the direct current to the output terminal 24. The area of the capacitor multiplier 266 is decreased and suitable to achieve the design of the full chip. Furthermore, the third resistor R3 make the voltage square wave accelerate a rise time of the signal, so that the waveform becomes better. As shown in FIG. 3C, after simulation tests, a voltage Vdd(V) and a power Pdc(W) of the distributed amplifier of the disclosure are lower than the voltage Vdd(V) and a power Pdc(W) of traditional distributed amplifier, and the current passed through the second resistor R2 of the second load circuit 22 is increased. As shown in FIG. 3D, the disclosure improves the power consumption and the gain of the circuit is maintained. The distributed amplifier of the disclosure is consistent with the traditional distributed amplifier before and after improvement, and the gain does not decreased. The distributed amplifier of the disclosure further modifies the position of the power supply and the direction of generating the current and adds the capacitor multiplier, so that the distributed amplifier may have the same performance without increasing the supply voltage, and the area of the chip does not need to be increased.

Figure 4A:
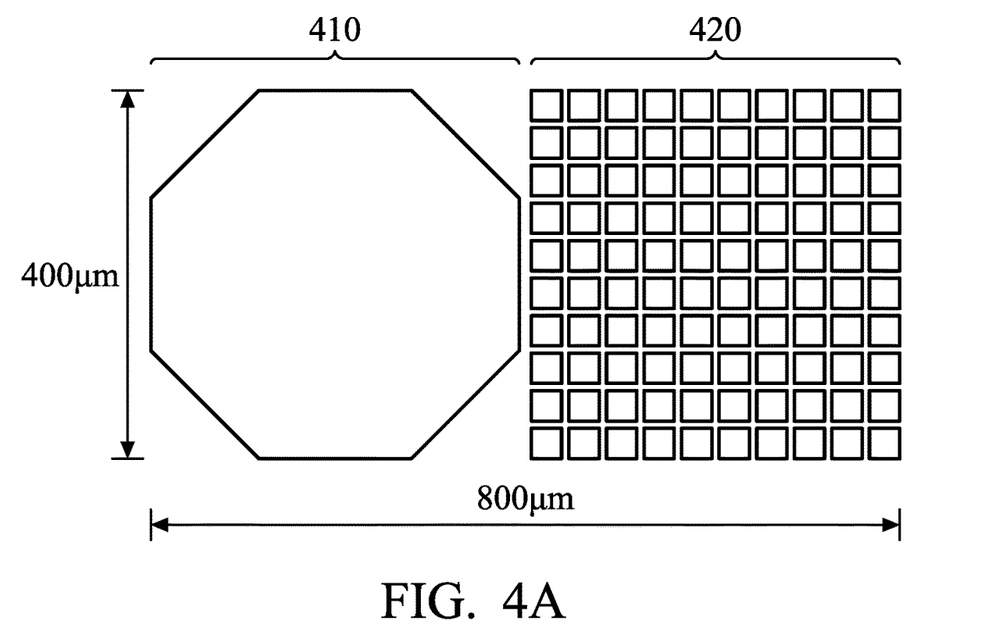
FIGS. 4A-4D show schematic views of area comparisons and test waveform diagrams of the traditional distributed amplifier and the distributed amplifier of the disclosure.
Figure 4B:
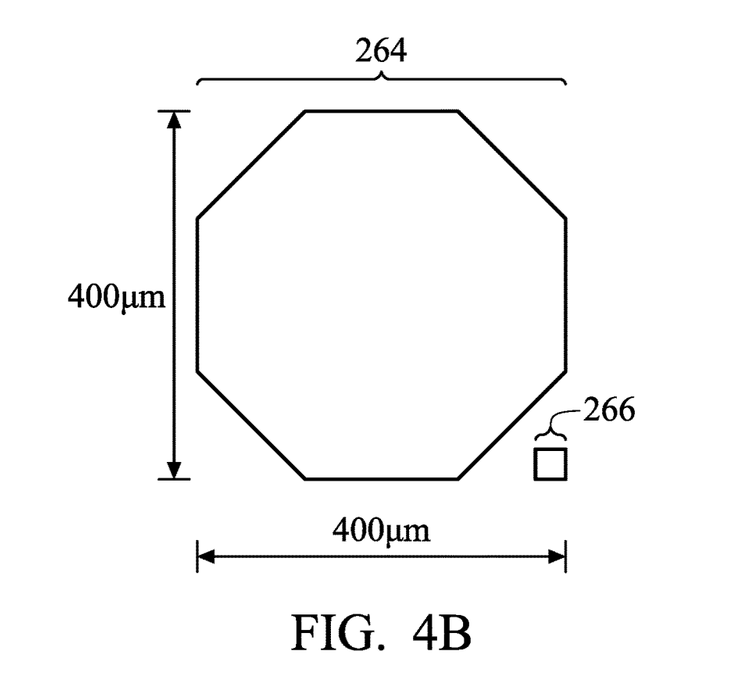
Figure 4C:
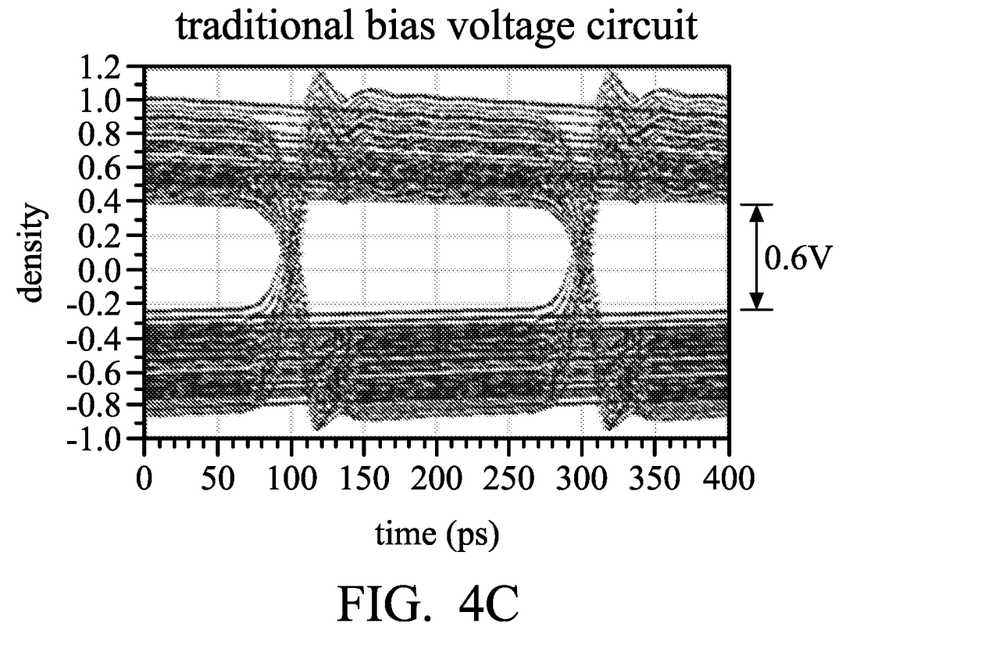
Figure 4D:
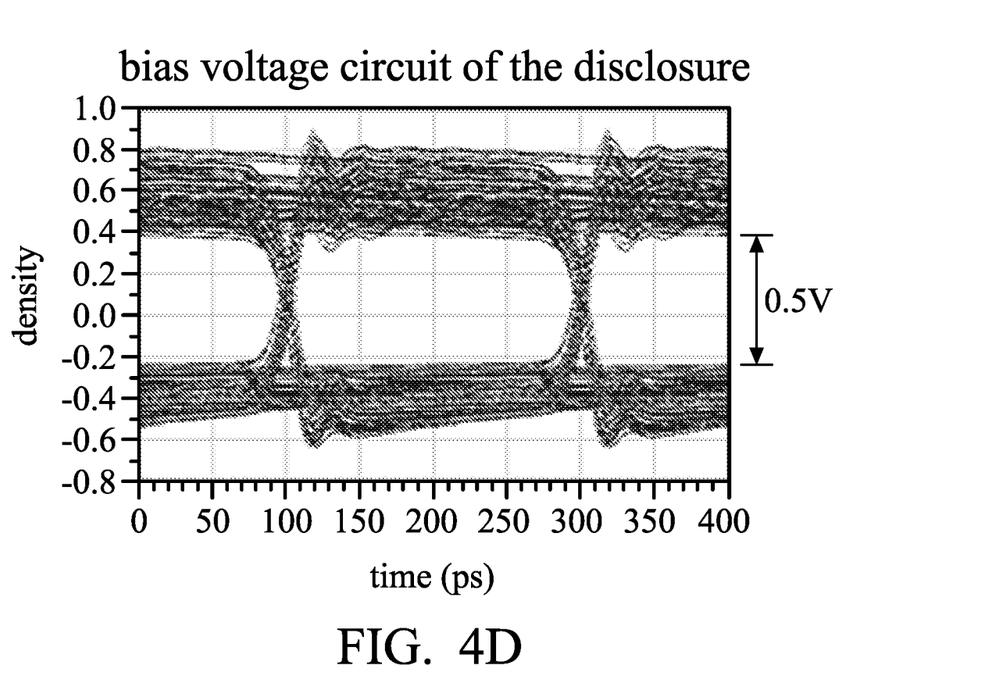

FIGS. 4A-4D show schematic views of area comparisons and test waveform diagrams of the traditional distributed amplifier and the distributed amplifier of the disclosure. As shown in FIG. 4A, the areas of the capacitor 420 and the inductor 410 of the traditional bias voltage circuit are larger, so that they may not designed in the full chip. As shown in FIG. 4B, the bias voltage circuit of the disclosure uses the capacitor multiplier 266 to make the wideband signal to be passed through, thereby achieving the design of the full chip. It can be seen that the area of the capacitor multiplier 266 of the disclosure is decreased. Accordingly, the distributed amplifier of the disclosure may have the same performance without increasing the supply voltage of the bias voltage circuit, and the area of the chip does not need to be increased. It can be seen from the waveform diagrams in FIGS. 4C-4D that the output signals of the traditional bias voltage circuit and the bias voltage circuit of the disclosure have not changed much.

In summary, the distributed amplifier with low supply voltage and low power consumption for the full-chip high-speed communication provided by the disclosure modifies the position of the bias voltage to avoid the voltage different generated by passing the large current through the load resistor resulted in increasing the voltage of the bias voltage circuit. The disclosure improves the problem of higher supply voltage and solves the problem of higher power consumption, thereby decreasing the power consumption. The disclosure further modifies the position of the power supply and the direction of generating the current and adds the capacitor multiplier, so that the distributed amplifier may have the same performance without increasing the supply voltage, and the area of the chip does not need to be increased.

While the disclosure has been described by way of example and in terms of the embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A distributed amplifier, comprising:
   an input terminal, configured to input an input signal;
   an output terminal, configured to output an output signal;
   an amplifier unit;
   a gate line circuit, connected to the input terminal, a first load circuit and the amplifier unit;
   a second load circuit;
   a drain line circuit, connected to the second load circuit, the amplifier unit and the output terminal; and
   a bias voltage circuit, connected to the drain line circuit and the output terminal, wherein the bias voltage circuit comprises:
   a voltage source;
   an inductor, connected to the voltage source and a terminal of the drain line circuit; and
   a capacitor multiplier, connected to the inductor, the drain line circuit and the output terminal;
   wherein the capacitor multiplier comprises a first resistor having a first terminal connected to the inductor and a drain of a first transistor and a second terminal connected to a gate of the first transistor and a capacitor, wherein a first terminal of the capacitor is connected to the gate of the first transistor and a second terminal of the capacitor is connected to a second resistor and a third resistor, a first terminal of the second resistor is connected to a source of the first transistor and the output terminal, a second terminal of the second resistor is connected to the third resistor, a first terminal of the third resistor is connected to the second resistor, and a second terminal of the third resistor is connected to a ground.

2. The distributed amplifier as claimed in claim 1, wherein the amplifier unit comprises a second transistor connected to the drain line circuit and the gate line circuit; and a third transistor coupled to the drain line circuit and the gate line circuit.

3. The distributed amplifier as claimed in claim 2, wherein the drain line circuit comprises a first inductor connected to the second load circuit and a second inductor; and a third inductor connected to the second inductor and the bias voltage circuit.

4. The distributed amplifier as claimed in claim 3, wherein a drain of the second transistor is connected to the first inductor and the second inductor of the drain line circuit, and a drain of the third transistor is connected to the second inductor and the third inductor of the drain line circuit.

5. The distributed amplifier as claimed in claim 3, wherein the gate line circuit comprises a fourth inductor connected to the input terminal and a fifth inductor; and a sixth inductor connected to the fifth inductor and the first load circuit.

6. The distributed amplifier as claimed in claim 5, wherein a gate of the second transistor is connected to the fourth inductor and the fifth inductor of the gate line circuit, and a gate of the second third transistor is connected to the fifth inductor and the sixth inductor of the gate line circuit.

7. The distributed amplifier as claimed in claim 1, wherein the first load circuit comprises a fourth resistor and a gate bias voltage, wherein the fourth resistor is connected to the gate line circuit and the (late bias voltage, and the (late bias voltage is connected to a ground.

8. The distributed amplifier as claimed in claim 1, wherein the second load circuit comprises a fourth resistor, connected to the drain line circuit and a ground.

\* \* \* \* \*